(12) United States Patent
Delehouze et al.

(10) Patent No.: US 11,976,355 B2
(45) Date of Patent: May 7, 2024

(54) METHOD FOR MANUFACTURING AN ENVIRONMENTAL BARRIER

(71) Applicants: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

(72) Inventors: Arnaud Delehouze, Moissy Cramayel (FR); Eric Bouillon, Moissy Cramayel (FR); Sylvain Lucien Jacques, Moissy Cramayel (FR)

(73) Assignees: CENTRE NATIONAL DE LA RECHERCHE SCIENTIFIQUE, Paris (FR); SAPRAN CERAMICS, Le Haillan (FR); UNIVERSITE DE BORDEAUX, Bordeaux (FR)

( * ) Notice: Subject to any disclaimer, the term of this patent is extended or adjusted under 35 U.S.C. 154(b) by 0 days.

(21) Appl. No.: 18/246,118

(22) PCT Filed: Sep. 20, 2021

(86) PCT No.: PCT/FR2021/051596
§ 371 (c)(1),
(2) Date: Mar. 21, 2023

(87) PCT Pub. No.: WO2022/069812
PCT Pub. Date: Apr. 7, 2022

(65) Prior Publication Data
US 2023/0287563 A1 Sep. 14, 2023

(30) Foreign Application Priority Data

Sep. 29, 2020 (FR) ........................ 2009876

(51) Int. Cl.
*C23C 16/40* (2006.01)
*C04B 41/45* (2006.01)
(Continued)

(52) U.S. Cl.
CPC ........ *C23C 16/401* (2013.01); *C04B 41/4531* (2013.01); *C23C 16/56* (2013.01);
(Continued)

(58) Field of Classification Search
None
See application file for complete search history.

(56) References Cited

U.S. PATENT DOCUMENTS 5,478,610 A * 12/1995 Desu ................ H01L 28/60
427/419.7
6,258,171 B1 * 7/2001 Agarwal ............ C23C 16/4405
118/723 R
(Continued)

FOREIGN PATENT DOCUMENTS

FR 2904006 * 7/2006 ........... C23C 16/448
FR 2 899 226 A1 10/2007
(Continued)

OTHER PUBLICATIONS

Jiang (J Therm Spray Tech (2020) 29:979-994). (Year: 2020).*
(Continued)

*Primary Examiner* — Bret P Chen
(74) *Attorney, Agent, or Firm* — Pillsbury Winthrop Shaw Pittman LLP

(57) ABSTRACT

A method for producing a part having improved resistance to oxidation and high temperature-corrosion, includes the formation of an environmental barrier coating on an at least partially ceramic matrix composite material, the environmental barrier coating being formed by direct liquid injection-metal organic chemical vapor deposition.

12 Claims, 1 Drawing Sheet

(51) Int. Cl.
*C23C 16/56* (2006.01)
*F01D 5/28* (2006.01)

(52) U.S. Cl.
CPC ........ *F01D 5/288* (2013.01); *F05D 2230/314* (2013.01); *F05D 2230/90* (2013.01); *F05D 2300/6033* (2013.01); *F05D 2300/611* (2013.01)

(56) References Cited

U.S. PATENT DOCUMENTS

| | | | | |
|---|---|---|---|---|
| 6,337,276 | B1 * | 1/2002 | Pyo | H01L 21/28556 438/681 |
| 7,714,155 | B2 * | 5/2010 | Sato | C07F 7/04 427/255.28 |
| 2009/0078791 | A1 | 3/2009 | Guillon et al. | |
| 2009/0169873 | A1 * | 7/2009 | Louchet-Pouillerie | F01D 5/282 428/446 |
| 2013/0323435 | A1 * | 12/2013 | Xiao | H01L 21/02126 546/14 |
| 2015/0004529 | A1 * | 1/2015 | Donet | H01M 4/8867 502/262 |
| 2015/0044444 | A1 * | 2/2015 | Gell | C23C 4/10 415/230 |
| 2015/0147871 | A1 * | 5/2015 | Xiao | H01L 21/02274 556/412 |
| 2015/0159507 | A1 * | 6/2015 | Sivaramakrishnan | F01D 5/288 428/596 |
| 2017/0022113 | A1 * | 1/2017 | Opila | F01D 5/288 |
| 2019/0003048 | A1 * | 1/2019 | Schuster | C23C 16/4412 |
| 2019/0040761 | A1 | 2/2019 | Carlin et al. | |

FOREIGN PATENT DOCUMENTS

| | | | | |
|---|---|---|---|---|
| KR | 10-2005-0019400 | * | 3/2005 | ............ C23C 16/00 |
| WO | WO-0231875 A2 | * | 4/2002 | ............ C23C 16/40 |

OTHER PUBLICATIONS

Boisselier, G., et al., "SiC coatings grown by liquid injection chemical vapor deposition using single source metal-organic precursors". Surface and Coatings Technology, 215 (2013) 152-160.*
Li, Zhefeng, et al., "Direct-Liquid-Injection Chemical Vapor Deposition of Nickel Nitride Films and Their Reduction to Nickel Films". Chemistry of Materials, 2010, 22, 3060-3066.*
Kang, S.W., et al., "Growth of bismuth oxide films by direct liquid injection-metal organic chemical vapor deposition with Bi(tmhd)3 (tmhd:2,2,6,6-tetramethyl-3,5-heptanedione)". Thin Solid Films, 468 (2004) 79-83.*
Song, Moon-Kyun, et al., "Direct liquid injection metal-organic chemical vapor deposition of HfO2 thin films using Hf(dimethylaminoethoxide)4". Thin Solid Films, vol. 450, Issue 2, Mar. 1, 2004, pp. 272-275.*
Jaud, Alexandre, et al., "Corrosion barrier alumina/zirconia bilayer stack on low Cr steel by direct liquid injection metalorganic chemical vapor deposition". Surface and Coatings Technology 462 (2023) 129476, pp. 1-12.*
Written Opinion of the International Searching Authority as issued in International Patent Application No. PCT/FR2021/051596, dated Jan. 17, 2022.
International Search Report as issued in International Patent Application No. PCT/FR2021/051596, dated Jan. 17, 2022.
Jones, A., et al., MOCVD of Zirconia Thin Films By Direct Liquid Injection Using a New Class of Zirconium Precursor II , Chemical Vapor Deposition, vol. 4, No. 2, Mar. 1998, XP000738248, pp. 46-49.

* cited by examiner

[Fig. 1]
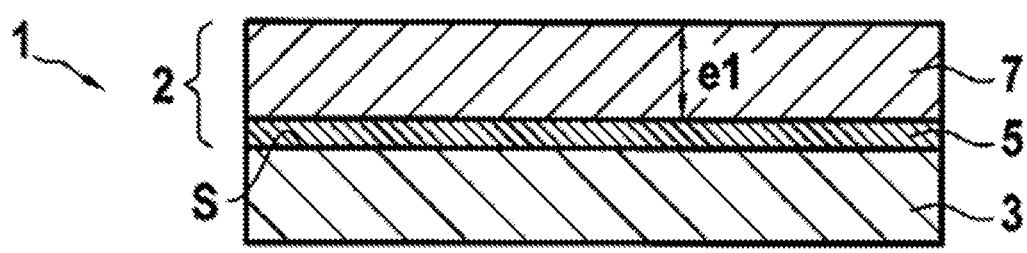
[Fig. 2]
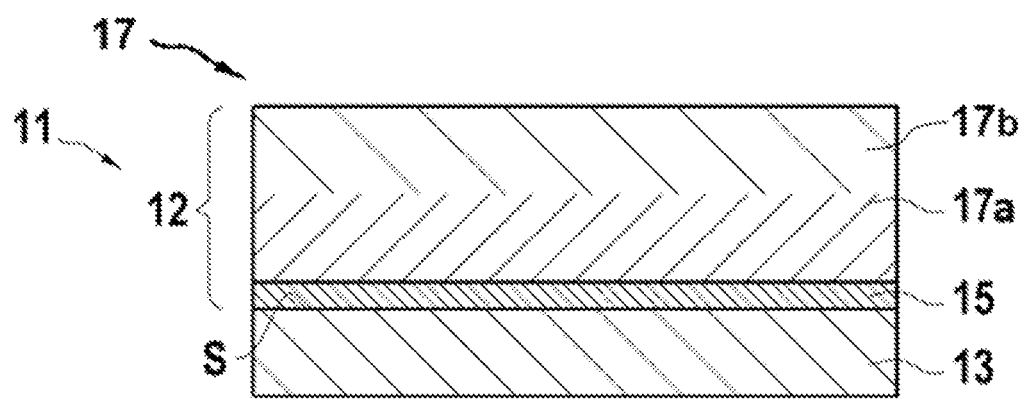

METHOD FOR MANUFACTURING AN ENVIRONMENTAL BARRIER

CROSS-REFERENCE TO RELATED APPLICATIONS

This application is the U.S. National Stage of PCT/FR2021/051596, filed Sep. 20, 2021, which in turn claims priority to French patent application number 20 09876 filed Sep. 29, 2020. The content of these applications are incorporated herein by reference in their entireties.

TECHNICAL FIELD

A particular field of application of the invention is the protection of at least partially ceramic matrix composite materials ("CMC materials") forming hot parts of gas turbines, such as combustion chamber walls, or turbine shrouds, turbine distributors or turbine blades, for aircraft engines or industrial turbines.

PRIOR ART

Improving efficiency and reducing polluting emissions leads to consider ever higher temperatures in the combustion chambers.

It has therefore been proposed to replace the metal materials with CMC materials, in particular for the walls of combustion chambers or turbine shrouds. Indeed, CMC materials are known to have both good mechanical properties allowing their use for structural elements and the ability to retain these properties at high temperatures. CMC materials can include a fibrous reinforcement made of refractory fibers, typically carbon or ceramic, which is densified by a ceramic matrix, for example silicon carbide.

Under the operating conditions of aeronautical turbines, that is to say at high temperature in an oxidizing and humid atmosphere, CMC materials are sensitive to the corrosion phenomenon. CMC corrosion results from the oxidation of silicon carbide into silica which, in the presence of water vapor, volatilizes in the form of silicon hydroxides $Si(OH)_4$. Corrosion phenomena lead to a recession of the CMC and affect its service life. In order to limit this degradation during operation, it has been considered to form environmental barriers on the surface of CMC materials ("Environmental barrier Coating"; "EBC"). The environmental barriers may include a silicon connecting coating as well as a rare earth silicate coating positioned over the connecting coating. The connecting coating allows, on the one hand, to improve the adhesion of the rare earth silicate coating and, on the other hand, to form a protective silica coating, whose low permeability to oxygen contributes to the protection of CMC against oxidation. The rare earth silicate coating allows, in turn, to limit the diffusion of water vapor towards the silica coating formed by oxidation of the silicon and consequently to limit the recession of said silica coating. Environmental barriers can be deposited by thermal spraying. In particular, US2019040761 is known which describes the formation of an EBC by such a method.

It nevertheless remains desirable to further improve the protection of CMC materials in an oxidizing and high temperature-corrosive environment, in particular greater than or equal to 800° C.

DISCLOSURE OF THE INVENTION

The present invention relates to a method for producing a part having improved resistance to oxidation and high temperature-corrosion, comprising at least the formation of an environmental barrier coating on an at least partially ceramic matrix composite material, said environmental barrier coating being formed by direct liquid injection-metal organic chemical vapor deposition.

The invention is based on the use of a particular deposition technique, namely direct liquid injection-metal organic chemical vapor deposition ("DLI-MOCVD") which uses one or more molecular precursors to create an environmental barrier on a CMC material. In the following and for reasons of brevity, this technique will be referred to as "DLI-MOCVD technique".

The DLI-MOCVD technique is used in the field of semiconductors but, to the knowledge of the inventors, has not been implemented to develop an environmental barrier protecting a CMC material.

The environmental barriers obtained by the DLI-MOCVD technique have fewer residual porosities and microcracks and a better controlled composition and microstructure than the environmental barriers obtained by thermal spraying. In this way, the environmental barriers obtained in the context of the invention are more impermeable (less porous) and have fewer internal stresses in operation associated with the differences in expansion between the desired barrier compound and undesired compounds also present (better controlled composition). The use of the DLI-MOCVD technique also allows to better control the composition of the deposition obtained, compared to the implementation of a conventional chemical vapor deposition CVD, and in particular to modulate the composition of the deposition by adapting the amounts used for the various precursors if this is desired. It is also possible to deposit pure phases and not mixed phases of the rare earth disilicate/rare earth monosilicate type as in thermal spraying. The fact of having a more efficient environmental barrier, in particular less porous, allows to reduce its thickness, which promotes the compatibility of the coefficients of thermal expansion between the environmental barrier and the underlying material. The production of depositions of reduced thickness is also particularly advantageous for certain parts where it is desired to maintain at least locally a very thin thickness despite the presence of the protective deposition, for example in the case of a trailing edge of a blade, as well as for the production of fine multicoating depositions (of the order of 10 μm per coating for example), these multicoating depositions being easily achievable by thermal spraying. Furthermore, the invention has the advantage of allowing the satisfactory use of precursors in liquid or solid form, the evaporation and entrainment of which in the gas state may be difficult to achieve or to control within the framework of a conventional chemical vapor deposition CVD method. The DLI-MOCVD technique also allows to dispense with the use of metal chloride precursors which are generally generated in the gas state in situ in conventional CVD methods, this generation being relatively complex to control as well as the management of the flowrate, and may generate hydrochloric acid as a reaction by-product which is corrosive and can degrade the deposition facility.

The environmental barrier coating obtained within the scope of the invention may have any composition. The environmental barrier coating can thus comprise at least one rare earth silicate, zirconia stabilized with a rare earth oxide or mullite ($3Al_2O_3 \cdot 2SiO_2$).

In an exemplary embodiment, the environmental barrier coating comprises a rare earth silicate and is formed at least from an alkoxysilane silicon oxide precursor and a rare earth beta-diketonate rare earth oxide precursor in the presence of an oxygen-supplying gas source. In particular, the silicon oxide precursor can be di-t-butoxydiacetoxysilane and the rare earth oxide precursor RE(thd)$_3$, where RE denotes a rare earth element and the group (thd) denotes 2,2,6,6-tetramethyl-3,5-heptanedionate, the rare earth oxide precursor being for example Y(thd)$_3$ (CAS no 15632-39-0).

These combinations of precursors are advantageous because RE(thd)$_3$ can be easily obtained commercially, is relatively simple to use and thermally stable, which allows to carry out depositions at high temperature and therefore to obtain high growth rates, and the di-t-butoxydiacetoxysilane has a decomposition temperature fairly close to RE(thd)$_3$. These two precursors are also miscible, which allows them to be used dissolved in the same solvent if desired.

The oxygen-supplying gas source may include at least one of the following gases: $O_2$, $N_2O$, $H_2O$, $CO_2$, $O_3$.

In an exemplary embodiment, the nature and/or the relative proportions of molecular precursors are modified during the formation of the environmental barrier coating so as to give it a changing composition.

The DLI-MOCVD technique allows to finely and continuously modulate the composition of the environmental barrier coating during its deposition in order to give it improved properties. It will be noted that it is also possible to deposit several successive environmental barrier coatings of well-defined and distinct composition. In particular, forming the environmental barrier coating may comprise at least forming a first portion comprising a rare earth disilicate, and forming a second portion comprising a rare earth monosilicate over the first portion.

The fact of positioning the monosilicate on the external side of the environmental barrier allows to further improve the resistance of the environmental barrier to recession insofar as the rare earth monosilicates are less sensitive to this phenomenon than the rare earth disilicates.

Alternatively, forming the environmental barrier coating comprises at least forming a first portion comprising a rare earth monosilicate, and forming a second portion comprising a rare earth disilicate over the first portion.

Alternatively or in combination, forming the environmental barrier coating comprises at least forming a first portion comprising a first rare earth silicate, and forming a second portion comprising a second rare earth silicate, different from the first rare earth, the first and second portions being superimposed.

Varying the nature of the rare earth along the environmental barrier improves its chemical resistance. For example, the first portion may comprise an ytterbium disilicate or an yttrium and ytterbium disilicate, and the second portion an yttrium monosilicate or a lutetium disilicate. Thus, the first portion provides improved corrosion protection and the second portion improved resistance to calcium and magnesium aluminosilicates (CMAS).

In an exemplary embodiment, the thickness of the environmental barrier coating is less than or equal to 1000 μm, for example less than or equal to 700 μm.

The DLI-MOCVD technique allows to reduce the thickness of the environmental barriers insofar as the latter have better properties.

The thickness of the environmental barrier coating can be greater than or equal to 200 μm, for example comprised between 200 μm and 1000 μm, for example between 200 μm and 700 μm.

In an exemplary embodiment, the method comprises depositing a bonding coating comprising silicon on the external surface of the at least partially ceramic matrix composite material, and the environmental barrier coating is deposited on said bonding coating. This bonding coating can be deposited by chemical vapor deposition.

In an exemplary embodiment, a thermal crystallization treatment of the environmental barrier coating formed is also carried out.

Depending on the production temperature, the environmental barrier may be amorphous. This crystallization treatment then allows to crystallize the deposition and to modulate the size of the grains in fine.

The temperature imposed during the crystallization heat treatment can be greater than or equal to 1250° C., for example 1350° C. This temperature can be less than or equal to 1400° C., for example if a bonding coating of silicon is present in order to avoid any risk of melting the latter.

The invention also relates to a part produced by implementing a method as described above, the part being a turbomachine part.

BRIEF DESCRIPTION OF THE DRAWINGS

FIG. 1 schematically illustrates a first example of a part having improved resistance to oxidation and high temperature-corrosion that can be obtained by implementing the invention.

FIG. 2 schematically illustrates a second example of a part having improved resistance to oxidation and high temperature-corrosion that can be obtained by implementing the invention.

DESCRIPTION OF EMBODIMENTS

FIG. 1 shows an example of part 1 comprising a CMC material 3 provided with an environmental barrier 2 which can be obtained by implementing the invention. The CMC material 3 can comprise a fibrous reinforcement which can be made of carbon fibers (C) or of ceramic fibers, for example of silicon carbide fibers (SiC) or formed essentially of SiC, including Si—CO or Si—CON fibers, that is to say also containing oxygen and possibly nitrogen. Such fibers are produced by the company Nippon Carbon under the reference "Nicalon" or "Hi-Nicalon" or "Hi-Nicalon Type-S", or by the company Ube Industries under the reference "Tyranno-ZMI". Ceramic fibers can be coated with a thin interphase coating made of pyrolytic carbon (PyC), boron nitride (BN) or boron-doped carbon (BC, with 5 at. % to 20 at. % of B, the complement being C).

The fibrous reinforcement is densified by an at least partially ceramic matrix, for example majoritarily in volume in ceramic. The ceramic matrix can comprise silicon carbide or an Si—B—C ternary system, for example. The matrix can be at least partly formed by CVI in a manner known per se. Alternatively, the matrix can be at least partly formed by a liquid process (impregnation with a precursor resin of the matrix and transformation by crosslinking and pyrolysis, the process being able to be repeated) or by infiltration of silicon in the molten state ("Melt-Infiltration" method). In the latter case, a powder is introduced into the optionally partially densified fibrous reinforcement, this powder possibly being a powder of carbon, ceramic, for example silicon carbide, or a mixture of such powders, and a metal composition based on silicon in the molten state is then infiltrated to form a matrix of the SiC—Si type. The fibrous reinforcement can be woven or not, the scope of the invention is not departed from when the fibrous reinforcement is in the form of short fibers dispersed in the material 3. Alternatively, it is possible to use a particulate reinforcement in the form of grains dispersed in the material 3.

The environmental barrier 2 can be formed over the entire outer surface S of the CMC material 3 or over only part of this surface S, for example when only part of the surface S needs to be protected. In the example illustrated in FIG. 1, the environmental barrier 2 comprises an environmental barrier coating 7 and a bonding coating 5 present between the CMC material 3 and the coating 7. In the example illustrated, the bonding coating 5 is present in contact with the surface S of the composite material 3. Furthermore, in this example, the coating 7 is in contact with the bonding coating 5.

The bonding coating 5 can, in a manner known per se, form in operation a protective silica coating against oxidation (coating called "TGO" coating for "Thermally Grown Oxide"). The bonding coating 5 can be made of silicon. The coating 7 is an environmental barrier coating providing protection against oxidation and high temperature-corrosion by limiting in particular the diffusion of water vapor and oxygen towards the bonding coating 5 and the CMC material 3. The coating 7 may include a rare earth silicate, for example a rare earth monosilicate and/or a rare earth disilicate, zirconia stabilized by a rare earth oxide, for example by yttrium oxide, or mullite.

The coating 7 may include at least one rare earth element selected from yttrium Y, scandium Sc and lanthanides. In particular, the rare earth element can be selected from yttrium Y and ytterbium Yb. It will be noted that it is not beyond the scope of the invention if the coating 7 comprises several rare earth elements, for example yttrium and ytterbium.

The coating 7 may have an equiaxed microstructure, which promotes mechanical strength and toughness. Alternatively, the coating 7 can have a columnar microstructure, promoting the resistance to thermal shocks.

The thickness $e_1$ of the coating 7 can be greater than or equal to 50 μm, for example greater than or equal to 200 μm, for example greater than or equal to 250 μm. This thickness $e_1$ can be comprised between 50 μm and 1000 μm, for example between 200 μm and 1000 μm or between 250 μm and 1000 μm, for example between 200 μm and 700 μm or between 250 μm and 700 μm. The coating 7 forms a coat covering the outer surface S of the CMC material 3, the thickness $e_1$ is measured from this outer surface.

Details relating to the production of the environmental barrier will now be described. The passage which will now be discussed provides details relating to the formation of the bonding coating 5.

The bonding coating 5 can be formed by chemical vapor deposition from a precursor comprising silicon comprising for example a silane, a monochlorosilane, a dichlorosilane, and/or a trichlorosilane. Two examples of formation of the bonding coating 5 by chemical vapor deposition are described below.

According to a first example, the temperature imposed during the deposition of the bonding coating 5 can be comprised between 900° C. and 1150° C., for example between 1100° C. and 1150° C., and the pressure imposed during this deposition can be comprised between 15.3 kPa and 20 kPa, for example between 16.7 kPa and 18 kPa. During deposition, the precursor comprising silicon can be introduced into the reaction chamber in which the CMC material 3 is present with a flowrate comprised between 0.05 grams/minute and 0.3 grams/minute, for example between 0.1 grams/minute and 0.2 grams/minute. According to this first example, the bonding coating 5 obtained has a crystalline microstructure. In particular, the bonding coating 5 may be made of silicon, this bonding coating 5 comprising for example columnar grains of crystalline silicon. Alternatively, the bonding coating 5 can be made of silicon alloy, for example of eutectic silicon alloy or of silicide.

According to a second example, the bonding coating 5 comprises an amorphous silicon phase having crystalline silicon grains distributed inside, these grains possibly having an average size comprised between 0.03 μm and 3 μm. The amorphous silicon phase can be formed from pure silicon or silicon with boron, oxygen and/or nitrogen dispersed therein. According to this second example, the bonding coating 5 can be formed at a deposition temperature which prevents the crystallization of the deposited silicon, followed by a heat treatment of the bonding coating at a treatment temperature higher than the temperature imposed during the deposition in order to form the crystalline silicon grains distributed in the amorphous silicon phase. The temperature imposed during the deposition can be comprised between 300° C. and 700° C. or between 700° C. and 1000° C., and the pressure imposed during the deposition can be comprised between 1.2 kPa and 1013 hPa. The operating conditions are chosen according to the precursor used. The treatment temperature can be comprised between 1000° C. and 1400° C., for example between 1200° C. and 1350° C. During deposition, the precursor comprising silicon can be introduced into the reaction chamber in which the CMC material 3 is present with a flowrate comprised between 0.1 gram/minute and 2 gram/minute.

The scope of the invention is not departed from when a method other than chemical vapor deposition is used to form the bonding coating 5, the latter being able, for example, alternatively, to be formed by thermal spraying from a powder or a mixture of powders having the desired composition.

The description continues with the provision of details relating to the production of the environmental barrier coating 7.

In the DLI-MOCVD technique, the molecular precursors of the environmental barrier coating 7 to be obtained are present in the liquid state, optionally being dissolved in an organic solvent, in at least one storage tank. Each of the molecular precursors may be present in a separate reservoir, or, if the molecular precursors are miscible, the latter may be present in the same storage reservoir. The precursors can thus be dissolved in the same organic solvent (liquid) in the same storage tank. The solvent can for example be toluene or mesitylene.

To deposit the coating 7, the molecular precursors in the liquid state are injected in the form of liquid droplets into an expansion chamber which is heated to a temperature such that the precursors are vaporized without causing their decomposition. It is possible, for example, to use an expansion chamber as described in document US 2009078791. The supply of molecular precursors in the liquid state into the expansion chamber can be regulated by a liquid flow meter. A vapor phase comprising a mixture of molecular precursors in the gas state is obtained in the expansion chamber by flash evaporation of the liquid precursors. This vapor phase is entrained by a carrier gas (such as argon or nitrogen) towards the reaction chamber in which the CMC material 3 is present. The CMC material 3 is heated to a temperature sufficient to allow the decomposition of the molecular precursors optionally in the presence of an oxygen-supplying gas source as mentioned above. The environmental barrier coating 7 is thus formed on the CMC material 3. The reaction chamber can be a reactor with hot walls or with cold walls. The latter case is advantageous in order to favor at high temperature the rapid formation of the deposition on the CMC material 3 and not the homogeneous reactions in the gaseous phase while respecting the degradation temperature of the precursors.

The composition of the coating 7 obtained depends on the molecular precursors used and their relative proportions introduced into the reaction chamber. The person skilled in the art knows how to choose the molecular precursors to be implemented among precursors known per se for the DLI-MOCVD technique in order to obtain the coating 7. The operating conditions to be implemented for the deposition are determined by the person skilled in the art empirically and by a known methodology. For example, the person skilled in the art can carry out several depositions by modulating the flowrates of the molecular precursors, then characterize these depositions and then refine, if necessary, the flowrate, temperature and pressure parameters in order to obtain the desired coating 7.

According to one example, the coating 7 can comprise an earth silicate and be formed at least from a silicon oxide molecular precursor, and a rare earth oxide molecular precursor in the presence of an oxygen-supplying gas source as described above.

According to another example, the coating 7 may comprise mullite and be formed at least from a silicon oxide molecular precursor, and from an aluminum oxide molecular precursor in the presence of an oxygen-supplying gas source as described above.

Regardless of the example considered, the silicon oxide molecular precursor can be an alkoxysilane, for example tetraethyl orthosilicate (TEOS) or di-t-butoxydiacetoxysilane (DADBS).

The aluminum oxide molecular precursor can be the association of trimethylaluminum (TMA) with the oxygen-supplying gas source, or an aluminum alkoxide (for example aluminum tris-isopropoxide, $Al(OiPr)_3$), or an aluminum β-diketonate (for example aluminum acetylacetonate, $Al(acac)_3$).

According to another example, the coating 7 can comprise zirconia stabilized by a rare earth oxide, for example yttria zirconia, and be formed at least from a zirconium oxide molecular precursor and from a rare earth oxide molecular precursor in the presence of an oxygen-supplying gas source as described above.

The zirconium oxide precursor can be selected from: zirconium alkoxides or zirconium beta-diketonates. As an example of usable zirconium alkoxide, mention may be made of zirconium tetra-tert-butoxide $Zr(OtBu)_4$, zirconium tetra-butoxide $Zr(OnBu)_4$ or zirconium tetra-propoxide $Zr(OnPr)_4$. As an example of usable zirconium beta-diketonate, mention may be made of $Zr(thd)_4$.

Regardless of the example considered, the rare earth oxide molecular precursor can be selected from: rare earth alkoxides or rare earth beta-diketonates. As an example of a rare earth alkoxide that can be used, mention may be made of $RE(mmp)_3$, where RE denotes a rare earth element and the (mmp) group 1-methoxy-2-methyl-2-propanolato. As an example of usable rare earth beta-diketonate, mention may be made of $RE(thd)_3$ where RE denotes a rare earth element.

As indicated above, the molecular precursors are in the liquid state. These precursors can be dissolved in a solvent if they are in the solid state under standard temperature and pressure conditions (pressure of 1 bar and temperature of 20° C.). For example, the rare earth oxide molecular precursor $Y(thd)_3$ is available in solid form and can be dissolved in toluene or mesitylene or else in benzene. Other molecular precursors, such as alkoxysilanes, can, in turn, already be in the liquid state under standard temperature and pressure conditions.

By way of example, the following operating conditions can be implemented during the formation of the environmental barrier coating 7:

the temperature of the reaction chamber in which the CMC material 3 is present can be comprised between 600° C. and 1200° C., for example between 800° C. and 1100° C., for example between 800° C. and 1000° C., and the pressure in the reaction chamber can be less than or equal to 1000 mbar, for example less than or equal to 100 mbar, for example less than or equal to 20 mbar. The pressure in the reaction chamber can be comprised between 0.3 mbar and 1000 mbar, for example between 2 mbar and 100 mbar, for example between 2 mbar and 20 mbar.

In the case of a coating 7 comprising a rare earth silicate, the ratio [amount of material of silicon oxide molecular precursor injected into the expansion chamber]/[amount of material of rare earth oxide molecular precursor injected into the expansion chamber] can be comprised between 0.1 and 10, for example between 0.2 and 5. The amounts of material are measured in moles (mol). Furthermore, the ratio [amount of material of oxygen-supplying gas source implemented]/[amount of material of precursors in the liquid state implemented] can be comprised between 0.1 and 10, for example between 0.5 and 5. The amount of material of precursors in the liquid state corresponds to the amount of material of liquid solvent comprising the precursors in the case where the latter are dissolved in a solvent.

Various details relating to the formation of the environmental barrier coating 7 by the DLI-MOCVD technique have just been described. Once this coating 7 has been formed, it can undergo one or more post-treatments which will now be described.

It is thus possible to subject the coating 7 to a decarburization treatment in order to eliminate the residual carbon provided by the ligands of the molecular precursors. The decarburization treatment can be carried out under an oxidizing atmosphere, which can comprise dioxygen, carbon monoxide or nitrous oxide. The temperature imposed during the decarburization treatment can be comprised between 800° C. and 1350° C., for example between 900° C. and 1100° C. The duration of the decarburization treatment can be comprised between 30 minutes and 5 hours. If the duration is too long, the crystallization treatment can be initiated. The person skilled in the art will work in pairs (time, temperature) tending to increase the treatment time when the temperature is low and vice versa.

Alternatively or in combination, the coating 7 can undergo a crystallization heat treatment in order to reduce the proportion of amorphous phase present. The crystallization heat treatment can be carried out at a temperature greater than or equal to 1250° C., for example 1350° C., for example comprised between 1300° C. and 1350° C. The duration of the crystallization heat treatment can be greater than or equal to 5 hours, for example greater than or equal to 25 hours, for example between 5 hours and 50 hours. By way of example for a coating 7 of yttrium disilicate, the crystallization heat treatment can be carried out at a temperature of 1350° C. for at least five hours.

The part 1 thus produced can be a part for an aeronautical or aerospace application. The part 1 can be a part of a hot part of a gas turbine of an aeronautical or aerospace engine or of an industrial turbine. The part 1 can be a turbomachine part. The part 1 can constitute at least part of a distributor, at least part of a nozzle or a thermal protection coating, a wall of a combustion chamber, a sector of a turbine shroud or a turbomachine blade.

Once obtained, the part 1 is used at high temperature, greater than or equal to 800° C., in an oxidizing and corrosive atmosphere. It can, in particular, be used at a temperature comprised between 800° C. and 1500° C., or even between 800° C. and 1300° C. The part 1 can, in particular, be used in humid air.

The example which has just been described relates to a part 1 having an environmental barrier coating 7 having a homogeneous composition. The environmental barrier coating may alternatively have a changing composition when the nature and/or the relative proportions of the molecular precursors are modified during deposition. A part 11 having an environmental barrier coating 17 of changing composition is illustrated in FIG. 2. The environmental barrier coating 17 comprises two superimposed portions 17a and 17b having a different composition. The transition from portion 17a to portion 17b may be continuous. According to one example, the portion 17a may comprise a rare earth disilicate and the portion 17b a rare earth monosilicate. The rare earth element of the monosilicate can be the same or different from the rare earth element of the disilicate. In the case of a monosilicate superimposed on a disilicate, the disilicate can be an yttrium disilicate and the monosilicate an ytterbium monosilicate. Alternatively or in combination, the portion 17a can comprise a silicate of a first rare earth and the portion 17b a silicate of a second rare earth, different from the first rare earth.

The characteristics of the CMC material 13, of the bonding coating 15 can be as described in connection with FIG. 1.

Moreover, the examples which have just been described, in connection with FIGS. 1 and 2, have an environmental barrier coating 7 or 17 forming the outer surface of the coated part, the coating 7 or 17 being the coating of the coat furthest from the CMC material 3. However, the scope of the invention is not departed from if this is not the case, the environmental barrier coating possibly being coated with an additional coat, for example a thermal barrier.

EXAMPLE

A test was carried out by the inventors using an evaporator heated to 175° C. with separate injection for each solution. The reaction chamber was a cold wall reactor in which was present a silicon substrate placed on a sample holder ("susceptor") heated by halogen lamps. The imposed temperature was 680° C. and the pressure imposed in the reaction chamber was 2.67 mbar.

The rare earth oxide precursor used was $Y(thd)_3$ dissolved at a rate of 0.01 M in toluene. The rate of injection of this solution into the evaporator was 0.75 g/min. The carrier gas (Ar) flowrate for this solution was 300 standard cubic centimeters per minute ("sccm").

The silicon oxide precursor used was di-t-butoxydiacetoxysilane (DADBS) dissolved at 0.01 M in toluene. The injection rate of this solution into the evaporator was 0.5 g/min. The carrier gas (Ar) flowrate for this solution was 300 sccm.

The ratio [molar amount $Y(thd)_3$]/[molar amount DADBS] was equal to 1.46. A flowrate of $O_2$ introduced into the reaction chamber was 40% of 400 sccm and a flowrate of $N_2$ introduced into the reaction chamber was 60% of 400 sccm.

The ratio [molar amount of 02 injected]/[molar amount of toluene containing the dissolved precursors] was 0.66. The approximate atomic composition of the deposition obtained measured by X-ray photoelectron spectroscopy was as follows: Y: 23%, Si: 19%, O: 56%, C: 2%.

The expression "comprised between . . . and . . . " must be understood as including the limits.

The invention claimed is:

1. A method for producing a part having improved resistance to oxidation and high temperature-corrosion, comprising forming an environmental barrier coating on an at least partially ceramic matrix composite material, said environmental barrier coating being formed by at least one molecular precursor in a gas state, by direct liquid injection-metal organic chemical vapor deposition, wherein, in the direct liquid injection-metal organic chemical vapor deposition, the at least one molecular precursor of the environmental barrier coating to be obtained is injected in the form of liquid droplets into an expansion chamber to be vaporized and thus form a vapor phase comprising the at least one molecular precursor in the gas state, and wherein said vapor phase is entrained towards a reaction chamber in which the composite material is present, said composite material being heated to a temperature sufficient to allow the decomposition of the at least one molecular precursor in the gas state to form the environmental barrier coating on the composite material.

2. The method according to claim 1, wherein the environmental barrier coating comprises a rare earth silicate and is formed at least from an alkoxysilane silicon oxide precursor and a rare earth beta-diketonate rare earth oxide precursor in the presence of an oxygen-supplying gas source.

3. The method according to claim 1, wherein the nature and/or the relative proportions of molecular precursors are modified during the formation of the environmental barrier coating so as to give the environmental barrier coating a changing composition.

4. The method according to claim 3, wherein forming the environmental barrier coating comprises at least forming a first portion comprising a rare earth disilicate, and forming a second portion comprising a rare earth monosilicate over the first portion.

5. The method according to claim 3, wherein forming the environmental barrier coating comprises at least forming a first portion comprising a rare earth monosilicate, and forming a second portion comprising a rare earth disilicate over the first portion.

6. The method according to claim 3, wherein forming the environmental barrier coating comprises at least forming a first portion comprising a first rare earth silicate, and forming a second portion comprising a second rare earth silicate, different from the first rare earth, the first and second portions being superimposed.

7. The method according to claim 1, wherein a thickness of the environmental barrier coating is less than or equal to 1000 μm.

8. The method according to claim 1, wherein the method further comprises depositing a bonding coating comprising silicon on an external surface of the at least partially ceramic matrix composite material, and wherein the environmental barrier coating is deposited on said bonding coating.

9. The method according to claim 8, wherein the bonding coating is deposited by chemical vapor deposition.

10. The method according to claim 1, wherein a thermal crystallization treatment of the environmental barrier coating formed is also carried out.

11. The method according to claim 1, wherein the part is a turbomachine part.

12. The method according to claim 1, wherein the composite material is heated in the reaction chamber in presence of an oxygen-supplying gas source.

\* \* \* \* \*

UNITED STATES PATENT AND TRADEMARK OFFICE
CERTIFICATE OF CORRECTION

PATENT NO. : 11,976,355 B2
APPLICATION NO. : 18/246118
DATED : May 7, 2024
INVENTOR(S) : Arnaud Delehouze et al.

It is certified that error appears in the above-identified patent and that said Letters Patent is hereby corrected as shown below:

On the Title Page

Item (73) Assignees should read as follows:
CENTRE NATIONAL DE LA RECHERCHE SCIENTIFIQUE, Paris (FR); SAFRAN CERAMICS, Le Haillan (FR), UNIVERSITE DE BORDEAUX, Bordeaux (FR)

Signed and Sealed this
Fourth Day of June, 2024

Katherine Kelly Vidal
*Director of the United States Patent and Trademark Office*